United States Patent
Friedrich et al.

(10) Patent No.: US 12,460,947 B2
(45) Date of Patent: Nov. 4, 2025

(54) ELECTRONIC MODULE, SENSOR APPARATUSES, SET OF SENSOR APPARATUSES AND METHOD FOR OPERATING A SENSOR APPARATUS

(71) Applicant: BALLUFF GmbH, Neuhausen (DE)

(72) Inventors: Michael Friedrich, Wolfschlugen (DE); Marc Bisch, Stuttgart (DE)

(73) Assignee: BALLUFF GmbH, Neuhausen (DE)

( * ) Notice: Subject to any disclaimer, the term of this patent is extended or adjusted under 35 U.S.C. 154(b) by 0 days.

(21) Appl. No.: 17/445,988

(22) Filed: Aug. 26, 2021

(65) Prior Publication Data

US 2022/0065663 A1    Mar. 3, 2022

(30) Foreign Application Priority Data

Aug. 28, 2020 (DE) ............... 10 2020 122 594.6

(51) Int. Cl.
  *G01D 5/20* (2006.01)
  *H03K 17/95* (2006.01)
  *G01B 7/02* (2006.01)
  *G01B 7/30* (2006.01)

(52) U.S. Cl.
  CPC ............ *G01D 5/202* (2013.01); *H03K 17/954* (2013.01); *G01B 7/023* (2013.01); *G01B 7/30* (2013.01); *H03K 2217/945* (2013.01)

(58) Field of Classification Search
  CPC ........ G01B 7/023; G01B 7/30; G01D 5/2013; G01D 5/202; H03K 17/9537; H03K 17/954; H03K 2217/945; H03K 3/00; H03K 4/00; H03K 5/00; H03K 6/00; H03K 7/00; H03K 9/00; H03K 11/00; H03K 12/00; H03K 17/00; H03K 19/00; H03K 21/00;
  (Continued)

(56) References Cited

U.S. PATENT DOCUMENTS

2011/0057668 A1   3/2011   Chen
2013/0314077 A1   11/2013  Okada et al.
(Continued)

FOREIGN PATENT DOCUMENTS

DE      10046147      2/2002
DE      102010009576  11/2010

*Primary Examiner* — Judy Nguyen
*Assistant Examiner* — Brent J Andrews
(74) *Attorney, Agent, or Firm* — Lipsitz & McAllister, LLC (57) ABSTRACT

An electronic module for an inductive sensor apparatus is provided which comprises at least one voltage-controlled current source, a current source port connected to the at least one voltage-controlled current source for providing a voltage-controlled current from the at least one voltage-controlled current source, an adder device, an adder input port connected to the adder device, and an adder output port which is connected to the adder device. The current source port is connectable to an electrical resonant circuit and/or to a coil element. The adder input port is connectable to the current source port or to at least one further coil element. By way of the adder device, an operation of addition and/or subtraction of a voltage applied to the adder input port and at least one offset voltage is performed. An evaluation signal for evaluation by an evaluation device is providable at the adder output port.

30 Claims, 6 Drawing Sheets

(58) Field of Classification Search
CPC ........ H03K 23/00; H03K 25/00; H03K 27/00; H03K 29/00; H03K 99/00; H03K 2217/00
See application file for complete search history.

(56) References Cited

U.S. PATENT DOCUMENTS

| | | | |
|---|---|---|---|
| 2014/0247040 A1* | 9/2014 | Reitsma | H03H 2/005 |
| | | | 324/207.15 |
| 2015/0185294 A1 | 7/2015 | Reitsma | |
| 2017/0302273 A1* | 10/2017 | Kántor | H01F 27/366 |
| 2019/0280690 A1* | 9/2019 | Mahler | H03K 17/9537 |

* cited by examiner

ELECTRONIC MODULE, SENSOR APPARATUSES, SET OF SENSOR APPARATUSES AND METHOD FOR OPERATING A SENSOR APPARATUS

The present disclosure relates to the subject matter disclosed in and claims the benefit of German application number 10 2020 122 594.6 of Aug. 28, 2020, which is incorporated herein by reference in its entirety and for all purposes.

BACKGROUND OF THE INVENTION

The invention relates to an electronic module for a sensor apparatus, in particular an inductive sensor apparatus.

The invention further relates to a sensor apparatus, in particular an inductive sensor apparatus.

The invention further relates to a further sensor apparatus, in particular an inductive sensor apparatus.

The invention further relates to a set of sensor apparatuses.

Furthermore, the invention relates to a method for operating a sensor apparatus, in particular an inductive sensor apparatus.

SUMMARY OF THE INVENTION

In accordance with an exemplary embodiment of the invention, there is provided an electronic module for a sensor apparatus that is flexible in application and by way of which a plurality of different sensor apparatuses can be implemented in a technically simple manner.

In accordance with an exemplary embodiment of the invention, the electronic module comprises at least one voltage-controlled current source, a current source port which is operatively and electrically connected to the at least one voltage-controlled current source for providing a voltage-controlled current by way of the at least one voltage-controlled current source, an adder device, an adder input port which is operatively and electrically connected to the adder device, and an adder output port which is operatively and electrically connected to the adder device, wherein the current source port is operatively and electrically connected, or operatively and electrically connectable, to an electrical resonant circuit and/or to a coil element, wherein the adder input port is operatively and electrically connectable, or is operatively and electrically connected, to the current source port or to at least one further coil element, wherein by way of the adder device, an operation of addition and/or subtraction of a voltage applied to the adder input port and at least one offset voltage is performed, and wherein an evaluation signal for evaluation by an evaluation device is providable, or is provided, at the adder output port.

The electronic module in accordance with the invention is particularly versatile and flexible in application. By way of the electronic module in accordance with the invention a multiplicity of different sensor apparatuses can be implemented in a technically simple manner.

In particular, by way of the electronic module in accordance with the invention, a multiplicity of different sensor apparatuses can be implemented without requiring for this purpose changes to the structure and/or to the topology of the electronic module.

In particular, for implementing different sensor apparatuses by way of the electronic module in accordance with the invention, no changes need be made to components of the electronic module. For example, it is not necessary to this result that changes be made to the at least one voltage-controlled current source and/or to the adder device.

For example, different sensor apparatuses can be implemented by way of different assignments of ports of the electronic module.

Thus, a multiplicity of different sensor apparatuses can be produced using the same electronic module in accordance with the invention. Different sensor apparatuses can thereby be produced, in particular, with an increased number of commonly shared parts and/or with decreased production expenditure.

In particular, provision may be made for the electronic module to be fabricated and/or implemented by way of discrete electronic component parts. In particular, use of an integrated circuit is not provided and/or necessary.

When it is said that the adder input port is operatively and electrically connected to the current source port, what is meant in particular is that the adder input port and the current source port are at equal electrical potentials.

It may be advantageous for the electrical resonant circuit and/or for the coil element to be capable of having, or to have, applied thereto an electric current and/or an electric voltage by way of the current source port and the at least one voltage-controlled current source. By application of an electric current and/or an electric voltage to the electrical resonant circuit, a harmonically oscillating system and/or an oscillator circuit is implemented, for example. As an alternative to this, for the case of applying an electric current and/or an electric voltage to the coil element, a pulsed system is implemented, for example.

By way of example, the electrical resonant circuit and/or the coil element are operatively and electrically connected to the current source port on the one hand and a supply voltage of the electronic module on the other.

For example, the at least one further coil element is operatively and electrically connected to the adder input port on the one hand and a supply voltage of the electronic module on the other.

In accordance with an exemplary embodiment of the invention, there is provided a sensor apparatus, comprising an electronic module in accordance with the invention and an electrical resonant circuit which is or becomes operatively and electrically connected to the current source port and the adder input port.

In particular, the sensor apparatus is an inductive sensor apparatus and/or an inductive proximity sensor and/or an inductive distance sensor and/or an inductive displacement sensor.

In the sensor apparatus in accordance with the invention, a harmonic oscillator and/or an oscillator circuit is implemented by way of the electrical resonant circuit.

In this variant, the sensor apparatus in accordance with the invention is embodied, for example, as an inductive distance sensor having a high switching distance or as a distance sensor having a large measuring range width.

In particular, provision may be made for the current source port and the adder input port to be operatively and electrically interconnected to each other and/or to be at equal electrical potentials. For example, a signal from the resonant circuit can thereby be incoupled into the adder device by way of the adder input port, and such signal can, for example, be outcoupled by way of the adder output port for its evaluation by an evaluation device.

It may be advantageous for the sensor apparatus to comprise a first voltage-controlled current source which is or becomes operatively and electrically connected to the current source port for providing the voltage-controlled current, wherein a control port is associated with the first voltage-controlled current source, wherein the first voltage-controlled current source is controllable, or becomes controlled, by way of a voltage applied to the control port, and wherein the control port is or becomes operatively and electrically connected to the adder output port. For example, a capability for feedback is thereby implemented from the adder output port to the control port of the first voltage-controlled current source. By way of example, a signal from the electrical resonant circuit is thereby fed back to the electrical resonant circuit by way of the adder device and the first voltage-controlled current source. For example, an oscillator circuit and/or a sensor apparatus can thereby be implemented having a high switching point.

It may be advantageous for the sensor apparatus to comprise a second voltage-controlled current source which is or becomes operatively and electrically connected to the current source port for providing the voltage-controlled current, wherein a first control port and a second control port are associated with the second voltage-controlled current source and wherein the second voltage-controlled current source is controllable, or becomes controlled, by way of a difference in voltages applied to the first control port and the second control port. For example, by using the first voltage-controlled current source and the second voltage-controlled current source, a sensor apparatus can be implemented having a large measuring range width.

It may be advantageous for the at least one offset voltage to be applied to the first control port or for the at least one offset voltage to become applied to the first control port. By way of the offset voltage, the second voltage-controlled current source can thereby be adjusted and/or calibrated.

In particular, the offset voltage is a direct voltage. By way of example, the offset voltage is approximately ⅓ of a supply voltage of the electronic module and/or the sensor apparatus.

Provision may be made for the offset voltage to be selected depending on temperature and/or to have a temperature dependence. A temperature measurement can thereby be implemented, for example.

In particular, provision may be made for the second control port to be or to become operatively and electrically connected to the adder output port.

In particular, the adder output port is then operatively and electrically connected to the second control port for controlling the second voltage-controlled current source and is operatively and electrically connected to the control port for controlling the first voltage-controlled current source. In particular, the first voltage-controlled current source and the second voltage-controlled current source are thereby activated. In particular, the first voltage-controlled current source and the second voltage-controlled current source are controlled by way of the signal applied to the adder output port.

By applying the offset voltage to the first control port associated with the second voltage-controlled current source and connecting the adder output port to the second control port associated with the second voltage-controlled current source, a sensor apparatus for distance measurement and/or a sensor apparatus having a large measuring range width can be implemented, for example.

In accordance with an exemplary embodiment of the invention, a further sensor apparatus is provided, comprising an electronic module in accordance with the invention and a coil element which is or becomes operatively and electrically connected to the current source port.

In particular, the further sensor apparatus described in the following has one or more features and/or advantages of the sensor apparatus described in the foregoing. In particular, the sensor apparatus described in the foregoing has one or more features and/or advantages described in the following.

In this variant, the sensor apparatus in accordance with the invention is configured, for example, as a pulsed measuring system. For example, the sensor apparatus in accordance with the invention is controlled by way of a measuring pulse.

In particular, the coil element of the sensor apparatus serves as a measuring coil.

It may be advantageous for the coil element to be or to become operatively and electrically connected to the adder input port. For example, a measuring signal can thereby be incoupled from the coil element into the adder device and this measuring signal can be outcoupled from the adder device by way of the adder output port for its further evaluation.

It may be advantageous for the current source port and the adder input port to be or to become operatively and electrically connected. For example, the current source port and the adder input port are then at equal electrical potentials.

It may be advantageous for the sensor apparatus to comprise at least one further coil element which is or becomes operatively and electrically connected to the adder input port. For example, a sensor apparatus comprising a transmit coil and at least one receive coil can thereby be implemented.

The coil element then serves, for example, as a transmit coil and the at least one further coil element serves, for example, as a receive coil.

For example, by way of the operative and electrical connection of the at least one further coil element to the adder input port, a receive signal of the at least one further coil element can be incoupled into the adder device and can then be outcoupled from the adder device for further evaluation thereof.

In particular, provision may be made for the coil element to be operatively and electrically connected to the current source port. In particular, the coil element (for example, the transmit coil) can thereby be excited and/or supplied with electrical energy by way of the at least one voltage-controlled current source and/or by way of a first voltage-controlled current source of the sensor apparatus.

In particular, provision may be made for the coil element to be operatively and electrically connected to the current source port and for the at least one further coil element to be operatively and electrically connected to the adder input port.

In particular, the current source port is then not in operative and electrical connection to the adder input port, and/or the current source port and the adder input port are at different electrical potentials at least during the time a measuring operation is performed.

In particular, the coil element in each case is operatively and electrically connected to the current source port and a supply voltage of the sensor apparatus.

In particular, the further coil element in each case is operatively and electrically connected to the adder input port and a supply voltage of the sensor apparatus.

In particular, provision may be made for the coil element and the at least one further coil element to be part of a common coil system and/or to be configured as a common coil system.

It may be advantageous for the sensor apparatus to comprise two further coil elements which are or become operatively and electrically connected to the adder input port, and in particular for the two further coil elements to be or to become operatively and electrically interconnected to each other in a series arrangement. A gradiometer arrangement can thereby be implemented, for example.

In particular, the series arrangement of the further coil elements is operatively and electrically connected to the adder input port on the one hand and to a supply voltage of the sensor apparatus on the other.

It may be advantageous for the sensor apparatus to comprise a first voltage-controlled current source which is or becomes operatively and electrically connected to the current source port for providing the voltage-controlled current, wherein a control port is associated with the first voltage-controlled current source and wherein the first voltage-controlled current source is controllable, or becomes controlled, by way of a voltage applied to the control port. For example, a measuring pulse can thereby be incoupled by way of the control port for performing a measurement. For example, a pulsed system can thereby be implemented.

It may be advantageous for the first voltage-controlled current source to be controllable and/or activatable and/or to be controlled and/or activated by way of an evaluation device and/or by way of a pulse signal source and/or by way of a pulse signal. In particular, measurements can be specifically controlled and/or performed by way of the evaluation device.

For example, the evaluation device and/or a pulse signal source are operatively and electrically connected to the control port for controlling the first voltage-controlled current source.

It may be advantageous for the sensor apparatus to comprise a second voltage-controlled current source which is or becomes operatively and electrically connected to the current source port for providing the voltage-controlled current, wherein a first control port and a second control port are associated with the second voltage-controlled current source and wherein the second voltage-controlled current source is controllable, or becomes controlled, by a difference in voltages applied to the first control port and the second control port.

In particular, provision may be made for the second voltage-controlled current source to be deactivated or to become deactivated, and/or for the first control port and the second control port to be at equal electrical potentials or to be caused to be at equal electrical potentials.

In particular, provision may be made for no voltage to be applied between the first control port and the second control port.

For example, the first control port and/or the second control port are free and/or not allocated and/or not connected.

It may be advantageous for the electronic module or the sensor apparatus to comprise a first voltage-controlled current source and/or a second voltage-controlled current source, wherein the voltage-controlled current is or becomes provided at the current source port by way of the first voltage-controlled current source and/or the second voltage-controlled current source.

In particular, provision may be made for the first voltage-controlled current source and/or the second voltage-controlled current source to in each case be operatively and electrically connected to the current source port. For example, a respective output port of the first voltage-controlled current source and/or the second voltage-controlled current source is operatively and electrically connected to the current source port.

In particular, a resistor and/or a port for a resistor are associated with the first voltage-controlled current source, wherein the first voltage-controlled current source is controllable, or becomes controlled, by way of the resistor and/or by way of the port for the resistor. For example, the resistor is operatively and electrically connected to the port on the one hand and to ground on the other.

For example, an operating point or operating point range of the first voltage-controlled current source is definable by way of the resistor associated with the first voltage-controlled current source.

In particular, a control port is associated with the first voltage-controlled current source, wherein the first voltage-controlled current source is controllable, or becomes controlled, by way of a voltage applied to the control port.

In particular, a resistor and/or a port for a resistor are associated with the second voltage-controlled current source, wherein the second voltage-controlled current source is controllable, or becomes controlled, by way of the resistor and/or by way of the port for the resistor. For example, the resistor is operatively and electrically connected to the port on the one hand and to ground on the other.

For example, an operating point or operating point range of the second voltage-controlled current source and/or a characteristic curve shape of the second voltage-controlled current source is definable by way of the resistor associated with the second voltage-controlled current source.

In particular, a first control port and a second control port are associated with the second voltage-controlled current source, wherein the second voltage-controlled current source is controllable; or becomes controlled, by way of a difference in voltages applied to the first control port and the second control port.

It may be advantageous for an output characteristic of the first voltage-controlled current source to be linear and/or for an output characteristic of the second voltage-controlled current source to be non-linear.

It may be advantageous for the first voltage-controlled current source to be implemented by way of an operational amplifier and/or by way of a transistor, in particular a bipolar transistor.

It may be advantageous for the second voltage-controlled current source to be implemented as a differential amplifier and/or for the second voltage-controlled current source to be implemented by way of two transistors, in particular bipolar transistors.

It may be advantageous for the electronic module or the sensor apparatus to comprise a housing and/or an interface. The assignment of ports of the electronic module can thereby occur in a technically simple manner. The electronic module can thereby be adapted to suit different applications in a technically simple manner.

For example, the current source port is arranged and/or formed at the housing and/or the interface.

For example, the adder input port is arranged and/or formed at the housing and/or the interface.

For example, the adder output port is arranged and/or formed at the housing and/or interface.

For example, a control port associated with a first voltage-controlled current source for controlling the first voltage-controlled current source is arranged and/or formed at the housing and/or the interface.

For example, a port for a resistor associated with a first voltage-controlled current source for controlling the first voltage-controlled current source is arranged and/or formed at the housing and/or the interface.

For example, a first control port and/or a second control port associated with a second voltage-controlled current source for controlling the second voltage-controlled current source are arranged and/or formed at the housing and/or the interface.

In particular, the second voltage-controlled current source is controllable by way of a difference in voltages applied to the first control port and the second control port, or becomes controlled by way of a difference in voltages applied to the first control port and the second control port.

For example, a port for a resistor associated with a second voltage-controlled current source for controlling the second voltage-controlled current source is arranged and/or formed at the housing and/or the interface.

For example, at least one offset voltage port for applying and/or incoupling the at least one offset voltage is arranged and/or formed at the housing and/or the interface.

In particular, the offset voltage port is operatively and electrically connected to the adder device.

For example, a first supply port and/or a second supply port are arranged and/or formed at the housing and/or the interface, wherein an operating voltage is capable of being applied, or is applied, between the first supply port and the second supply port for supplying energy to the electronic module and/or the sensor apparatus.

For example, the first supply port is connected to ground and/or earth.

For example, a (for example positive) supply voltage is applied to the second supply port.

In particular, as used herein, a port is understood to be a physical port and/or a connection terminal.

In particular, provision may be made for the electronic module or the sensor apparatus to comprise an evaluation device for evaluating a measuring signal.

For example, the evaluation device is operatively and electrically connected to the adder output port.

In particular, by the discrete implementation of components of the electronic module (for example, first voltage-controlled current source, second voltage-controlled current source and adder device) by way of an operational amplifier and/or a transistor, adaptation of the electronic module to different resonance frequencies of the coil elements can be achieved.

In particular, the electronic module in accordance with the invention can be adapted to different resonant frequencies of the electrical resonant circuit and/or the coil element and/or the at least one further coil element. For example, discrete components of the electronic module are selected and/or designed differently depending on the respective resonant frequencies, in particular wherein, here, no adaptation of the structure and/or topology of the electronic module is needed. The electronic module can thereby be adapted to resonant frequencies of less than 1 MHz or more than 1 MHz.

In accordance with an exemplary embodiment of the invention, there is provided a set of sensor apparatuses, comprising at least two different sensor apparatuses selected from any of the following:

a sensor apparatus, comprising:
an electronic module, comprising:
at least one voltage-controlled current source;
a current source port which is operatively and electrically connected to the at least one voltage-controlled current source for providing a voltage-controlled current by way of the at least one voltage-controlled current source;
an adder device;
an adder input port which is operatively and electrically connected to the adder device; and
an adder output port which is operatively and electrically connected to the adder device;
wherein the current source port is operatively and electrically connected, or operatively and electrically connectable, to at least one of an electrical resonant circuit and a coil element;
wherein the adder input port is operatively and electrically connectable, or is operatively and electrically connected, to the current source port or to at least one further coil element;
wherein by way of the adder device, at least one of an operation of addition and an operation of subtraction of a voltage applied to the adder input port and at least one offset voltage is performed;
wherein an evaluation signal for evaluation by an evaluation device is providable, or is provided, at the adder output port; and
wherein an electrical resonant circuit is provided which is or becomes operatively and electrically connected to the current source port and the adder input port; and
a sensor apparatus, comprising:
an electronic module, comprising:
at least one voltage-controlled current source;
a current source port which is operatively and electrically connected to the at least one voltage-controlled current source for providing a voltage-controlled current by way of the at least one voltage-controlled current source;
an adder device;
an adder input port which is operatively and electrically connected to the adder device; and
an adder output port which is operatively and electrically connected to the adder device;
wherein the current source port is operatively and electrically connected, or operatively and electrically connectable, to at least one of an electrical resonant circuit and a coil element;
wherein the adder input port is operatively and electrically connectable, or is operatively and electrically connected, to the current source port or to at least one further coil element;
wherein by way of the adder device, at least one of an operation of addition and an operation of subtraction of a voltage applied to the adder input port and at least one offset voltage is performed;
wherein an evaluation signal for evaluation by an evaluation device is providable, or is provided, at the adder output port; and
wherein a coil element is provided which is or becomes operatively and electrically connected to the current source port.

In particular, the set of sensor apparatuses comprises a plurality of different sensor apparatuses in each case. In particular, different sensor apparatuses, here, are understood to mean sensor apparatuses of different technical configurations.

In particular, the sensor apparatuses of the set of sensor apparatuses are implemented by way of the electronic module in accordance with the invention. In particular, the sensor apparatuses of the set of sensor apparatuses are each implemented by way of the same electronic module.

In particular, in order to implement the sensor apparatuses of the set of sensor apparatuses, there is no need to make changes to a structure and/or topology of the electronic module in accordance with the invention. In particular, the sensor apparatuses of the set of sensor apparatuses can be implemented by employing a different assignment and/or connection of ports of the (same) electronic module in accordance with the invention.

In accordance with an exemplary embodiment of the invention, there is provided a method for operating a sensor apparatus, in which method are provided at least one voltage-controlled current source, a current source port operatively and electrically connected to the at least one voltage-controlled current source, an adder device, an adder input port operatively and electrically connected to the adder device, and an adder output port operatively and electrically connected to the adder device, wherein a voltage-controlled current is provided at the current source port by way of the at least one voltage-controlled current source, wherein the current source port is operatively and electrically connected to an electrical resonant circuit and/or to a coil element, wherein the adder input port is operatively and electrically connected to the current source port or to at least one further coil element, wherein an operation of addition and/or subtraction of a voltage applied to the adder input port and at least one offset voltage is performed, and wherein an evaluation signal for evaluation by an evaluation device is provided at the adder output port.

In particular, the method in accordance with the invention has one or more features and/or advantages mentioned in connection with the electronic component in accordance with the invention and/or the sensor apparatuses in accordance with the invention.

Advantageous embodiments of the method in accordance with the invention have also been described in connection with the electronic module in accordance with the invention and/or the sensor apparatuses in accordance with the invention.

The following description of preferred embodiments, taken in conjunction with the drawings, serves to explain the invention in greater detail.

DETAILED DESCRIPTION OF THE INVENTION

The same reference numerals refer to the same or functionally equivalent elements in all figures.

Figure 1:
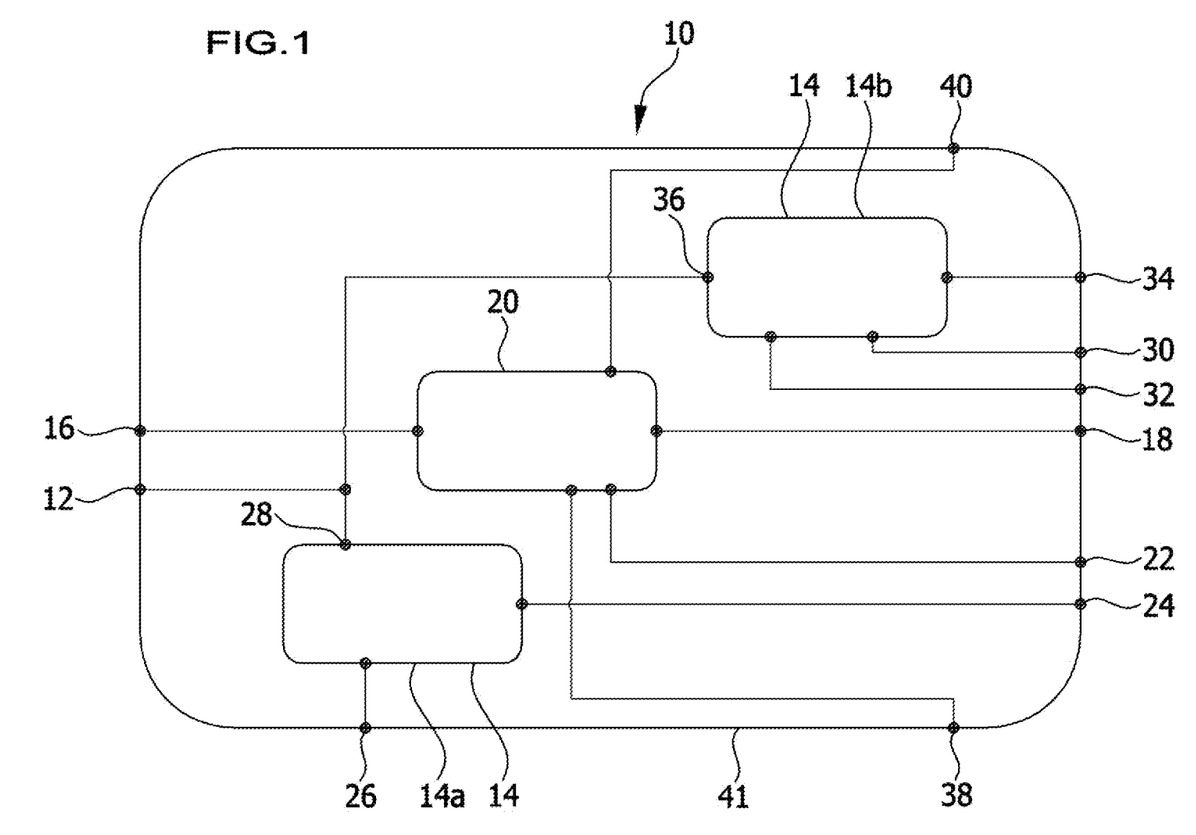
FIG. 1 shows a schematic representation of an electronic module for a sensor apparatus.

An exemplary embodiment of an electronic module, shown in FIG. 1 and designated therein by the reference numeral 10, is for example an electronic module for use with a sensor apparatus, and in particular an inductive sensor apparatus.

The electronic module 10 comprises a current source port 12 for providing a voltage-controlled current.

For example, at least one voltage-controlled current source 14 is provided for providing the voltage-controlled current, which voltage-controlled current source 14 is operatively and electrically connected to the current source port 12.

Further, the electronic module 10 comprises an adder input port 16 and an adder output port 18 for establishing operative and electrical connection to an adder device 20.

By way of the adder device 20, an operation of addition and/or subtraction of a voltage applied to the adder input port 16 and an offset voltage is performed.

To incouple the offset voltage, the electronic module 10 comprises an offset voltage port 22 to which the offset voltage can be applied. Said offset voltage port 22 is operatively and electrically connected to the adder device 20.

To control the at least one voltage-controlled current source 14, the electronic module 10 comprises a control port 24 which is operatively and electrically connected to the at least one voltage-controlled current source 14. For example, the at least one voltage-controlled current source 14 can be controlled by way of a voltage applied to the control port 24.

Further, the electronic module 10 comprises a port 26 for a resistor associated with the at least one voltage-controlled current source 14, wherein said port 26 is operatively and electrically connected to the at least one voltage-controlled current source 14. By way of said resistor, the at least one voltage-controlled current source 14 can be controlled, and/or an operating point or operating point range of the t least one voltage-controlled current source 14 can be adjusted by way of said resistor.

In the exemplary embodiment as illustrated in FIG. 1, a first voltage-controlled current source 14a and a second voltage-controlled current source 14b are provided.

The control port 24 and the port 26 are associated with the first voltage-controlled current source 14a and/or are operatively and electrically connected to the first voltage-controlled current source 14a.

The first voltage-controlled current source 14a comprises an output port 28 operatively and electrically connected to the current source port 12.

The first voltage-controlled current source 14a has a linear output characteristic, for example.

To control the second voltage-controlled current source 14b, the electronic module comprises a first control port 30 and a second control port 32, wherein the first control port 30 and the second control port 32 are each operatively and electrically connected to the second voltage-controlled current source 14b. In particular, the second voltage-controlled current source 14b can be controlled by way of a difference between voltages applied to the first control port 30 and the second control port 32.

Further, the electronic module 10 comprises a port 34 for a resistor associated with the second voltage-controlled current source 14b, wherein said port 34 is operatively and electrically connected to the second voltage-controlled current source 14b. By way of said resistor, the second voltage-controlled current source 14b can be controlled, and/or an operating point or operating point range of the second voltage-controlled current source 14b can be adjusted by way of said resistor.

The second voltage-controlled current source 14b comprises an output port 36 operatively and electrically connected to the current source port 12.

By way of example, the output port 28 of the first voltage-controlled current source 14a and/or the output port 36 of the second voltage-controlled current source 14b and/or the current source port 12 are each operatively and electrically interconnected to each other.

The second voltage-controlled current source 14b has a non-linear output characteristic, for example.

The electronic module 10 comprises a first supply port 38 and a second supply port 40, wherein an operating voltage for the electronic module can be applied between the first supply port 38 and the second supply port 40.

For example, provision is made for the first supply port 38 to be operatively and electrically coupled to ground and the second supply port 40 to a (for example positive) supply voltage.

In particular, the first supply port 38 and the second supply port 40 serve to supply energy to the adder device 20 and/or to the at least one voltage-controlled current source 14 and/or to the first voltage-controlled current source 14a and/or to the second voltage-controlled current source 14b. In particular, the adder device 20 and/or the at least one voltage-controlled current source 14 and/or the first voltage-controlled current source 14a and/or the second voltage-controlled current source 14b are each operatively and electrically connected to the first supply port 38 and the second supply port 40.

Provision may be made for the electronic module 10 to comprise a housing 41 and/or an interface and/or a frontend at which are arranged and/or formed the respective ports of the electronic module 10. By way of example, the respective ports of the electronic module 10 are implemented as physical port elements and/or as connection terminals. The respective ports of the electronic module 10 are understood to be the current source port 12 and/or the adder input port 16 and/or the adder output port 18 and/or the offset voltage port 22 and/or the control port 24 and/or the port 26 and/or the first control port 30 and/or the second control port 32 and/or the port 34 and/or the first supply port 38 and/or the second supply port 40.

Figure 2:
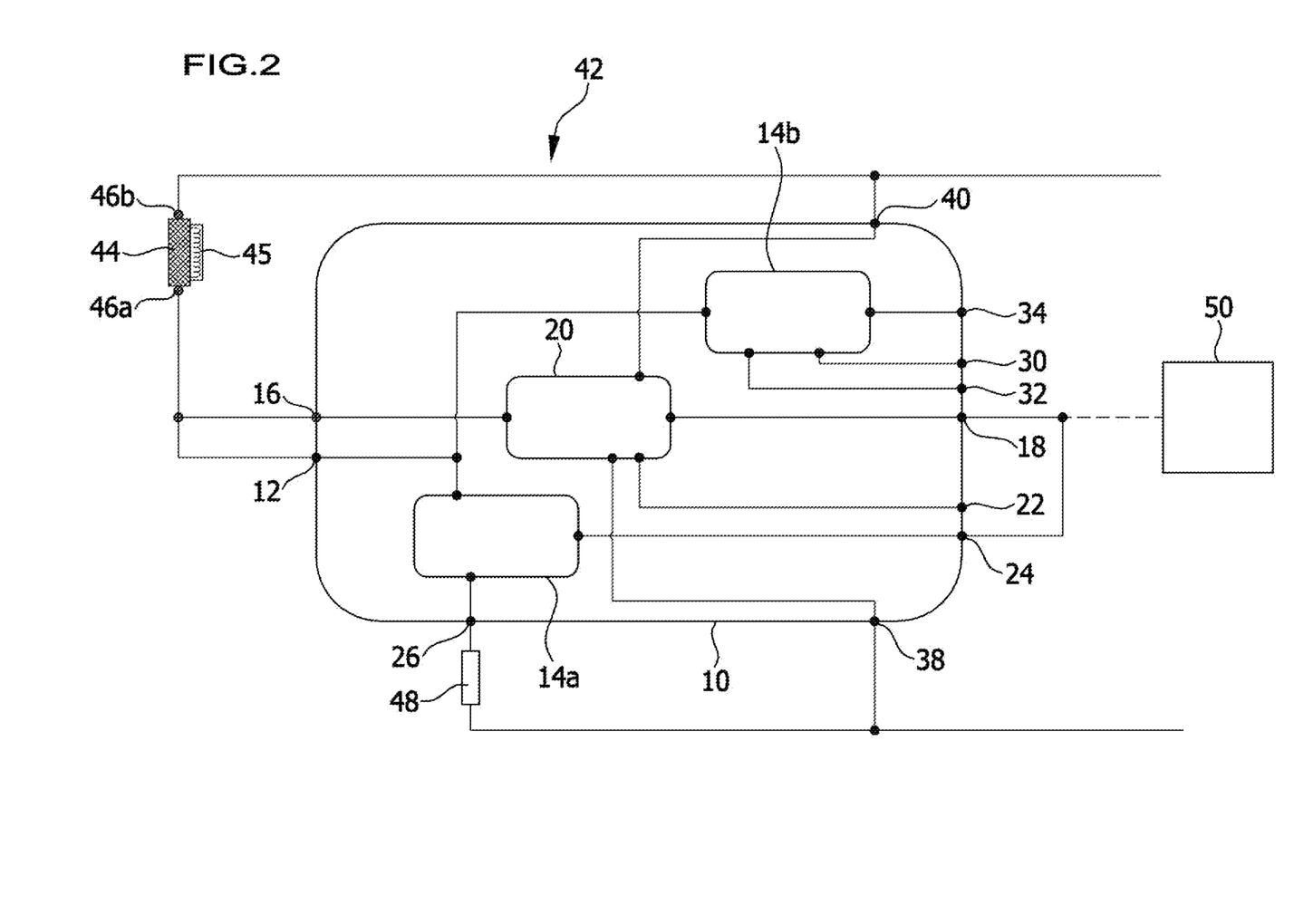
FIG. 2 shows a schematic representation of a first exemplary embodiment of a sensor apparatus, comprising an electronic module and a resonant circuit operatively and electrically connected to the electronic module.

A first exemplary embodiment of a sensor apparatus 42 comprising an electronic module 10 as described in the foregoing is illustrated in FIG. 2. The sensor apparatus 42 comprises the electronic module 10 having the first voltage-controlled current source 14a and the adder device 20. The sensor apparatus 42 is an inductive sensor apparatus in particular.

Generally, inductive sensor apparatuses work with a sensor coil element (inductance). By way of said sensor coil element, a magnetic field is generated which changes as an object is moved past the sensor coil element. It is thereby possible, for example, for angles, displacements, distances and speeds to be measured without contact and without wear.

Regarding the general principle of operation of such inductive sensors, reference is made to "Sensoren in Wissenschaft and Technik" by E. Hering and G. Schönfelder (editors), Springer Fachmedien Wiesbaden, 2012.

In the exemplary embodiment as illustrated in FIG. 2, the sensor apparatus 42 comprises an electrical resonant circuit 44 which comprises, in particular, a coil element 45 (indicated in FIG. 2) and/or a capacitor element (not shown). In particular, the coil element of the electrical resonant circuit 44 serves as a sensor coil element.

The coil element 45 of the electrical resonant circuit 44 is, for example, a single-wound coil element. The coil element 45 comprises a copper Litz wire and/or a high frequency Litz wire, for example.

For example, the electrical resonant circuit 44 comprises a first port 46a and a second port 46b for incoupling electrical energy into the electrical resonant circuit 44 and/or for exciting the electrical resonant circuit 44. In particular, an electric current and/or an electrical voltage can be applied to the electrical resonant circuit 44 by way of the first port 46a and the second port 46b.

By way of example, the coil element and the capacitor element are (in current direction) arranged between the first port 46a and the second port 46b.

The electrical resonant circuit 44 is configured, for example, as a parallel resonant circuit from the coil element and the capacitor element. By way of example, the coil element and the capacitor element are implemented as a parallel arrangement between the first port 46a and the second port 46b.

In the exemplary embodiment in accordance with FIG. 2, the first port 46a of the electrical resonant circuit 44 in each case is operatively and electrically connected to the current source port 12 and the adder input port 16.

In particular, the current source port 12 and the adder input port 16 are operatively and electrically interconnected to each other. In particular, the current source port 12 and/or the adder input port 16 are at equal electrical potentials.

The second port 46b is operatively and electrically connected to a supply voltage and/or to the second supply port 40.

Further, the adder output port 18 is operatively and electrically connected to the control port 24 for controlling the first voltage-controlled current source 14a. In particular, the adder output port 18 and the control port 24 are at equal electrical potentials.

Thus, the first voltage-controlled current source 14a is controlled and/or activated by way of the signal from the adder device 20, applied to the adder output port 18.

Associated with the first voltage-controlled current source 14a is a resistor 48 which is operatively and electrically connected to the port 26. In particular, the resistor 48 is (in current direction) arranged between the port 26 and the first supply port 38 and/or ground.

A value of the resistor 48 is selected depending, in particular, on properties (an inductance, for example) of the coil element 45. For example, the value of the resistor 48 is approximately 1 to 15 kΩ.

In the embodiment in accordance with FIG. 2, the second voltage-controlled current source 14b is deactivated or not present. By way of example, the second voltage-controlled current source 14b is deactivated in that there exists no voltage difference between the first control port 30 and the second control port 32.

In particular, the first control port 30 and/or the second control port 32 and/or the port 34, these being associated with the second voltage-controlled current source 14b, are not allocated and/or not connected.

The offset voltage applied to the offset voltage port 22 is approximately ¼ to ⅓ of a supply voltage applied between the first supply port 38 and the second supply port 40.

For example, the offset voltage applied to the offset voltage port 22 is generated by way of a resistive voltage divider.

Provision may be made for the offset voltage to have a temperature dependence (relative to an ambient temperature of the sensor apparatus 42).

Provided at the adder output port 18 is an output signal of the electronic module 10 for its evaluation by an evaluation device 50 (indicated in FIG. 2). By way of example, the adder output port is operatively connected to the evaluation device 50 for electric and/or signal communication therewith.

The evaluation device 50 comprises, for example, a demodulator and/or an analogue-to-digital converter and/or a microcontroller.

For example, the sensor apparatus 42 shown in FIG. 2 is configured as an inductive sensor apparatus and/or as an inductive proximity switch having a high switching distance.

In particular, by way of the electrical resonant circuit 44 and the electronic module 10 in the exemplary embodiment in accordance with FIG. 2, an oscillator circuit and/or a harmonic oscillator is implemented.

Figure 3:
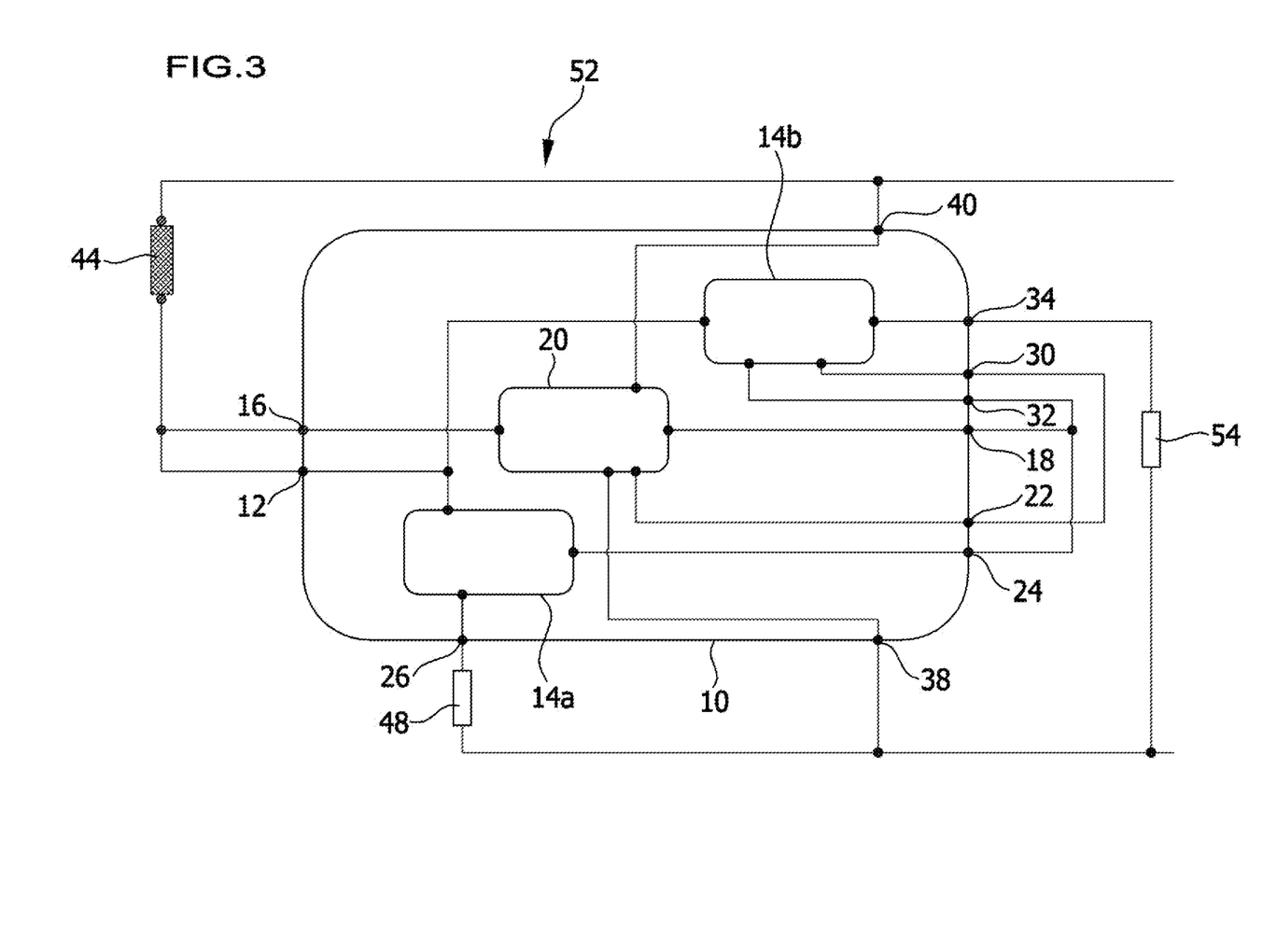
FIG. 3 shows a schematic representation of a second exemplary embodiment of a sensor apparatus, comprising an electronic module and a resonant circuit operatively and electrically connected to the electronic module.

A second exemplary embodiment of a sensor apparatus 52 as illustrated in FIG. 3 differs from the embodiment in accordance with FIG. 2 essentially in that the second voltage-controlled current source 14b is present and/or activated in the sensor apparatus 52. As for the rest, the variant shown in FIG. 3 is constructed and operates in the same manner as discussed for the variant shown in FIG. 2, and in that respect reference may be had to what has been described above for the case of said variant.

The sensor apparatus 52 comprises the electronic module 10 having the first voltage-controlled current source 14a, the second voltage-controlled current source 14b and the adder device 20.

The first control port 30 of the second voltage-controlled current source 14b is operatively and electrically connected to the offset voltage port 22. This offset voltage port 22 in turn is operatively and electrically connected to the adder device 20. In particular, the offset voltage is in each case applied to the first control port 30 and the offset voltage port 22.

In particular, the second control port 32 and the offset voltage port 22 are at equal electrical potentials.

The adder output port 18 is operatively and electrically connected to the second control port 32 for controlling the second voltage-controlled current source 14b. Furthermore, the adder output port 18 is operatively and electrically connected to the control port 24 for controlling the first voltage-controlled current source 14a.

Thus, in the exemplary embodiment in accordance with FIG. 3, the first voltage-controlled current source 14a and the second voltage-controlled current source 14b are controlled and/or activated by way of the signal from the adder device 20, applied to the adder output port 18.

Associated with the second voltage-controlled current source 14b is a resistor 54 which is operatively and electrically connected to the port 34. By way of said port 34, the resistor 48 is operatively and electrically connected to the second voltage-controlled current source 14b. In particular, the resistor 54 is (in current direction) arranged between the port 34 and the first supply port 38 and/or ground.

A value of the resistor 54 is selected depending, in particular, on properties (an inductance, for example) of the coil element 45. For example, the value of the resistor 54 is approximately 300 to 1000 kΩ.

For example, the sensor apparatus 52 as illustrated in FIG. 3 is configured as an inductive sensor apparatus for distance measurement having a large measuring range width.

Figure 4:
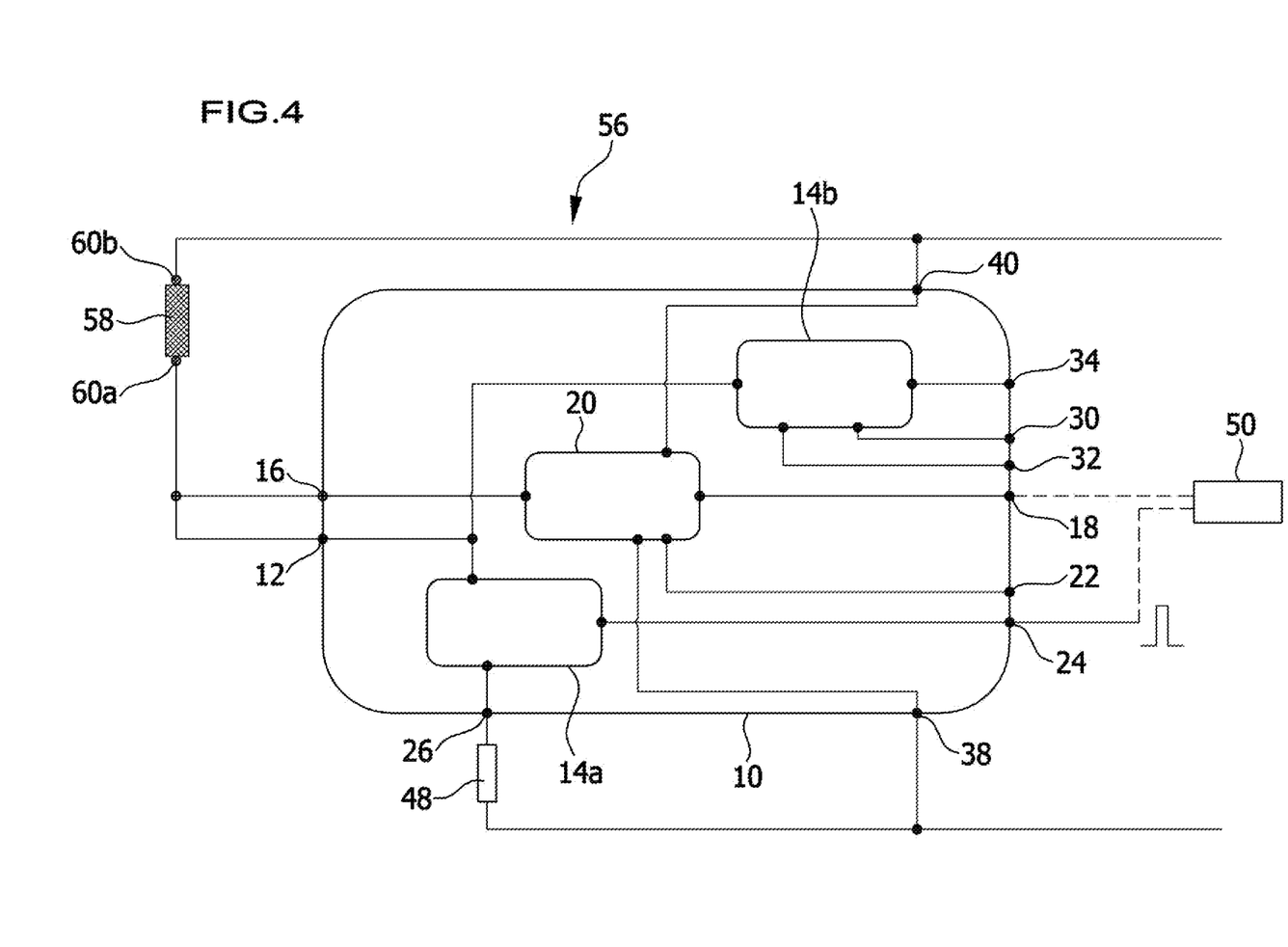
FIG. 4 shows a schematic representation of a third exemplary embodiment of a sensor apparatus, comprising an electronic module and a coil element operatively and electrically connected to the electronic module.

A third exemplary embodiment of a sensor apparatus 56 shown in FIG. 4 comprises a coil element 58 which in each case is operatively and electrically connected to the current source port 12 and the adder input port 16. The sensor apparatus 56 basically operates in the same way as discussed for the sensor apparatuses 42 and 52. Thus, as regards the principles of operation of the sensor apparatus 56, reference may be had to what has been discussed in the above description.

In particular, the third exemplary embodiment of the sensor apparatus 56 described in the following has one or more features and/or advantages of the sensor apparatuses 42 and 52 described in the foregoing.

In particular, the coil element 58 has one or more features and/or advantages of the coil element 45 described in the foregoing.

The sensor apparatus 56 comprises the electronic module 10, the first voltage-controlled current source 14a and the adder device 20.

The resistor 48 is operatively and electrically connected to the first voltage-controlled current source 14a.

The coil element 58 of the sensor apparatus 56 is or comprises a sensor coil, for example.

In particular, the coil element 58 comprises a first port 60a and a second port 60b for incoupling electrical energy into the coil element 58. In particular, an electric current and/or an electrical voltage can be applied to the coil element 58 by way of the first port 60a and the second port 60b.

The first port 60a in each case is operatively and electrically connected to the current source port 12 and the adder input port 16. The second port 60b is operatively and electrically connected to the supply voltage and/or to the second supply port 40.

In particular, the current source port 12 and the adder input port 16 are at equal electrical potentials.

The offset voltage is applied to the offset voltage port 22.

In the sensor apparatus 56, it is provided that, for controlling the first voltage-controlled current source 14a, a signal, in particular a pulse signal, is applied to the control port 24 and/or is incoupled by way of the control port 24. The first voltage-controlled current source 14a is thereby controlled, for example, by way of an externally generated signal which is applied to the control port 24.

Provision may be made for the signal applied to the control port 24 to be a pulse signal and/or a measuring pulse, wherein the pulse signal and/or the measuring pulse is generated, for example, by way of the evaluation device 50.

By way of example, the evaluation device 50 is in each case operatively connected to the adder output port 18 and/or to the control port 24 for electric and/or signal communication therewith.

In particular, in the embodiment of the sensor apparatus 56 in accordance with FIG. 4, the second voltage-controlled current source 14b is deactivated or not present. By way of example, the second voltage-controlled current source 14b is deactivated in that there exists no voltage difference between the first control port 30 and second control port 32.

In particular, the first control port 30 and/or the second control port 32 and/or the port 34, these being associated with the second voltage-controlled current source 14b, are free and/or not allocated and/or not connected.

For example, the sensor apparatus 56 shown in FIG. 4 is configured as an inductive sensor apparatus using a (single)

coil element, wherein a measurement operation is initiated by way of a measuring pulse in particular.

For example, by way of the coil element 58 and the electronic module 10 in the exemplary embodiment in accordance with FIG. 4, a pulsed system is implemented.

Figure 5:
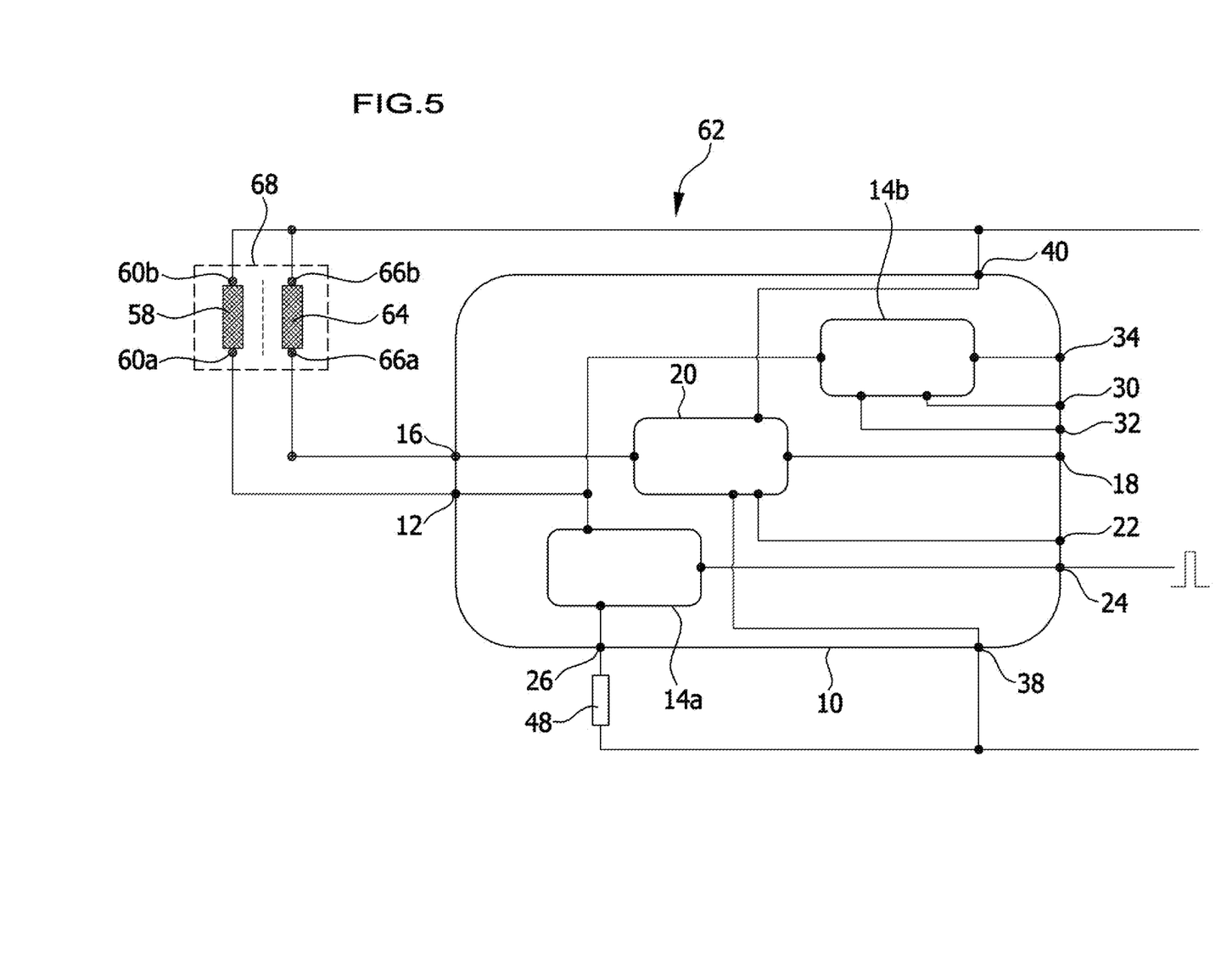
FIG. 5 shows a schematic representation of a fourth exemplary embodiment of a sensor apparatus, comprising an electronic module, a coil element and a further coil element, which are each operatively and electrically connected to the electronic module.

A fourth exemplary embodiment of a sensor apparatus 62 shown in FIG. 5 differs from the embodiment in accordance with FIG. 4 essentially in that the sensor apparatus 62 comprises, besides the coil element 58, a further coil element 64. As for the rest, the variant shown in FIG. 5 is constructed and operates in the same manner as discussed for the variant shown in FIG. 4, and in that respect reference may be had to what has been described above for the case of said variant.

In the exemplary embodiment in accordance with FIG. 5, the coil element 58 serves as a transmit coil and the further coil element 64 serves as a receive coil.

In particular, the further coil element 64 has one or more features and/or advantages of the aforementioned coil elements 45 and 58.

By way of example, the coil element 58 and the further coil element 64 are arranged in spatially symmetric relation to each other and/or in spatially opposite relation to each other.

In particular, the further coil element 64 comprises a first port 66a and a second port 66b for incoupling electrical energy into the coil element 64. In particular, an electric current and/or an electrical voltage can be applied to the coil element 64 by way of the first port 66a and the second port 66b.

The coil element 58 is operatively and electrically connected to the current source port 12 and the further coil element 64 is operatively and electrically connected to the adder input port 16.

In the exemplary embodiment in accordance with FIG. 5, the current source port 12 and the adder input port 16 are, in particular, not at equal electrical potentials. In particular, the current source port 12 and the adder input port 16 are not (directly) operatively and electrically interconnected to each other.

For example, the first port 60a of the coil element 58 is operatively and electrically connected to the current source port 12. By way of example, the first port 66a of the further coil element 64 is operatively and electrically connected to the adder input port 16.

The second port 60b of the coil element 58 and/or the second port 66b of the further coil element 64 are in each case operatively and electrically connected to the supply voltage and/or to the second supply port 40, for example.

Provision may be made for the coil element 58 and the further coil element 64 to be part of a common coil system 68.

For example, the coil element 58 and/or the further coil element 64 are configured in the form of printed circuit board (PCB) coils.

For example, in the sensor apparatus 62 in accordance with FIG. 5, measurement is realized by way of a transmit coil (coil element 58) and a receive coil (coil element 68).

Figure 6:
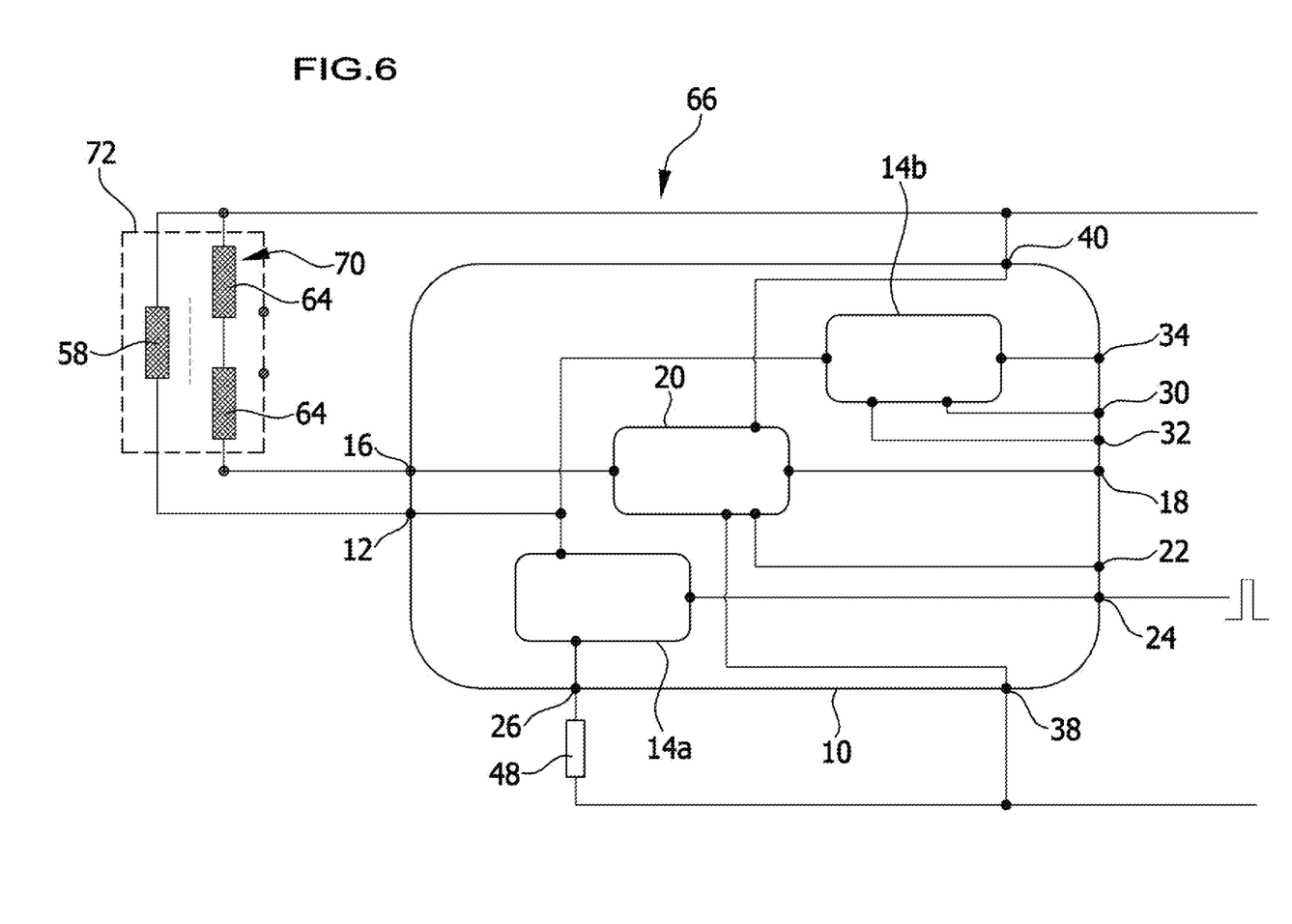
FIG. 6 shows a schematic representation of a fifth exemplary embodiment of a sensor apparatus, comprising an electronic module, a coil element and two further coil elements, which are each operatively and electrically connected to the electronic module.

A fifth exemplary embodiment of a sensor apparatus 66 shown in FIG. 6 differs from the embodiment in accordance with FIG. 5 essentially in that the sensor apparatus 66 comprises two further coil elements 64 which are connected in series relative to one another. As for the rest, the variant shown in FIG. 6 is constructed and operates in the same way as discussed for the variant shown in FIG. 5, and in that respect reference may be had to what has been described above for the case of said variant.

The two further coil elements 64 are operatively and electrically interconnected to each other in a series arrangement 70. The series arrangement 70 of the two further coils is operatively and electrically connected to the adder input port 16 and/or to the second supply port 40.

The coil element 58 is operatively and electrically connected to the current source port 12 and/or to the second supply port 40.

In particular, the coil element 58 serves as a transmit coil and the two further coil elements 64 serve as receive coils. A gradiometer arrangement is thereby implemented for example.

By way of example, the coil element 58 and the two further coil elements 64 are arranged in spatially symmetric relation to each other and/or in spatially opposite relation to each other.

In particular, the two further coil elements 64 are of the same type.

By way of the coil element 58 and the series arrangement 70 of the two further coil elements 64, a coil system 72 is implemented, for example. In particular, the coil system 72 is a gradiometer coil system.

For example, by way of the coil system 70 and the electronic module 10 in the exemplary embodiment in accordance with FIG. 6a, gradiometer system and/or a gradiometer arrangement is implemented.

LIST OF REFERENCE CHARACTERS 10 electronic module
12 current source port
14 voltage-controlled current source
14a first voltage-controlled current source
14b second voltage-controlled current source
16 adder input port
18 adder output port
20 adder device
22 offset voltage port
24 control port
26 port
28 output port
30 first control port
32 second control port
34 port
36 output port
38 first supply port
40 second supply port
41 housing
42 sensor apparatus
44 electrical resonant circuit
45 coil element
46a first port
46b second port
48 resistor
50 evaluation device
52 sensor apparatus
54 resistor
56 sensor apparatus
58 coil element
60a first port
60b second port
62 sensor apparatus
64 further coil element
66a first port
66b second port
68 coil system
70 series arrangement
72 coil system

What is claimed is:

1. An electronic module for a sensor apparatus, said electronic module comprising:
    at least one voltage-controlled current source;
    a current source port which is operatively and electrically connected to the at least one voltage-controlled current source for providing a voltage-controlled current by way of the at least one voltage-controlled current source;
    an adder device;
    an adder input port which is operatively and electrically connected to the adder device and is adapted to establish connections between the adder device and at least one first external device; and
    an adder output port which is operatively and electrically connected to the adder device and is adapted to establish connections between the adder device and at least one second external device;
    wherein the current source port is operatively and electrically connected, or operatively and electrically connectable, to at least one of an electrical resonant circuit and a coil element;
    wherein the adder input port is operatively and electrically connectable, or is operatively and electrically connected, to the current source port or to at least one further coil element;
    wherein by way of the adder device, at least one of an operation of addition and an operation of subtraction of a voltage applied to the adder input port and at least one offset voltage is performed;
    wherein an evaluation signal for evaluation by an evaluation device is providable, or is provided, at the adder output port;
    wherein the at least one first external device comprises the electrical resonant circuit and the coil element; and
    the at least one second external device comprises the evaluation device.

2. The electronic module in accordance with claim 1, wherein at least one of the electrical resonant circuit and the coil element are capable of having, or have, applied thereto at least one of an electric current and an electric voltage by way of the current source port and the at least one voltage-controlled current source.

3. The electronic module in accordance with claim 1, wherein at least one of a first voltage-controlled current source and a second voltage-controlled current source are provided, wherein the voltage-controlled current is or becomes provided at the current source port by way of at least one of the first voltage-controlled current source and the second voltage-controlled current source.

4. The electronic module in accordance with claim 3, wherein at least one of the following conditions is satisfied:
    at least one of a resistor and a port for a resistor are associated with the first voltage-controlled current source, wherein the first voltage-controlled current source is controllable, or becomes controlled, by way of the at least one of the resistor and the port for the resistor;
    a control port is associated with the first voltage-controlled current source, wherein the first voltage-controlled current source is controllable, or becomes controlled, by way of a voltage applied to the control port.

5. The electronic module in accordance with claim 3, wherein at least one of the following conditions is satisfied:
    at least one of a resistor and a port for a resistor are associated with the second voltage-controlled current source, wherein the second voltage-controlled current source is controllable, or becomes controlled, by way of the at least one resistor and the port for the resistor;
    a first control port and a second control port are associated with the second voltage-controlled current source, wherein the second voltage-controlled current source is controllable; or becomes controlled, by way of a difference in voltages applied to the first control port and the second control port.

6. The electronic module in accordance with claim 3, wherein at least one of (i) an output characteristic of the first voltage-controlled current source is linear and (ii) an output characteristic of the second voltage-controlled current source is non-linear.

7. The electronic module in accordance with claim 3, wherein the first voltage-controlled current source is implemented by at least one of an operational amplifier and a transistor.

8. The electronic module in accordance with claim 3, wherein at least one of (i) the second voltage-controlled current source is implemented as a differential amplifier and (ii) the second voltage-controlled current source is implemented by way of two transistors.

9. The electronic module in accordance with claim 1,
    wherein at least one of a housing and an interface is provided, wherein at least one of the following is at least one of (i) arranged and (ii) formed at at least one of the housing and the interface:
    the current source port;
    the adder input port;
    the adder output port;
    a control port associated with a first voltage-controlled current source for controlling the first voltage-controlled current source;
    a port for a resistor associated with a first voltage-controlled current source for controlling the first voltage-controlled current source;
    at least one of a first control port and a second control port associated with a second voltage-controlled current source for controlling the second voltage-controlled current source;
    a port for a resistor associated with a second voltage-controlled current source for controlling the second voltage-controlled current source;
    at least one offset voltage port for at least one of (i) applying and (ii) incoupling the at least one offset voltage;
    at least one of a first supply port and a second supply port, wherein an operating voltage is capable of being applied, or is applied, between the first supply port and the second supply port for supplying energy to at least one of the electronic module and the sensor apparatus.

10. A sensor apparatus, comprising:
    an electronic module, comprising:
    at least one voltage-controlled current source;
    a current source port which is operatively and electrically connected to the at least one voltage-controlled current source for providing a voltage-controlled current by way of the at least one voltage-controlled current source;
    an adder device;
    an adder input port which is operatively and electrically connected to the adder device and is adapted to establish connections between the adder device and at least one first external device; and
    an adder output port which is operatively and electrically connected to the adder device and is adapted to establish connections between the adder device and at least one second external device;

wherein the current source port is operatively and electrically connected, or operatively and electrically connectable, to at least one of an electrical resonant circuit and a coil element;

wherein the adder input port is operatively and electrically connectable, or is operatively and electrically connected, to the current source port or to at least one further coil element;

wherein by way of the adder device, at least one of an operation of addition and an operation of subtraction of a voltage applied to the adder input port and at least one offset voltage is performed;

wherein an evaluation signal for evaluation by an evaluation device is providable, or is provided, at the adder output port;

wherein an electrical resonant circuit is provided which is or becomes operatively and electrically connected to the current source port and the adder input port;

wherein the at least one first external device comprises the electrical resonant circuit and the coil element; and the at least one second external device comprises the evaluation device.

11. The sensor apparatus in accordance with claim 10, wherein a first voltage-controlled current source is provided which is or becomes operatively and electrically connected to the current source port for providing the voltage-controlled current, wherein a control port is associated with the first voltage-controlled current source, wherein the first voltage-controlled current source is controllable, or becomes controlled, by way of a voltage applied to the control port, and wherein the control port is or becomes operatively and electrically connected to the adder output port.

12. The sensor apparatus in accordance with claim 10, wherein a second voltage-controlled current source is provided which is or becomes operatively and electrically connected to the current source port for providing the voltage-controlled current, wherein a first control port and a second control port are associated with the second voltage-controlled current source and wherein the second voltage-controlled current source is controllable, or becomes controlled, by way of a difference in voltages applied to the first control port and the second control port.

13. The sensor apparatus in accordance with claim 12, wherein at least one of (i) the at least one offset voltage is applied to the first control port or the at least one offset voltage becomes applied to the first control port, and (ii) the second control port is or becomes operatively and electrically connected to the adder output port.

14. The sensor apparatus in accordance with claim 10, wherein at least one of a first voltage-controlled current source and a second voltage-controlled current source are provided, wherein the voltage-controlled current is or becomes provided at the current source port by way of at least one of the first voltage-controlled current source and the second voltage-controlled current source.

15. The sensor apparatus in accordance with claim 14, wherein at least one of the following conditions is satisfied:
at least one of a resistor and a port for a resistor are associated with the first voltage-controlled current source, wherein the first voltage-controlled current source is controllable, or becomes controlled, by way of the at least one of the resistor and the port for the resistor;
a control port is associated with the first voltage-controlled current source, wherein the first voltage-controlled current source is controllable, or becomes controlled, by way of a voltage applied to the control port.

16. The sensor apparatus in accordance with claim 14, wherein at least one of the following conditions is satisfied:
at least one of a resistor and a port for a resistor are associated with the second voltage-controlled current source, wherein the second voltage-controlled current source is controllable, or becomes controlled, by way of the at least one resistor and the port for the resistor;
a first control port and a second control port are associated with the second voltage-controlled current source, wherein the second voltage-controlled current source is controllable;
or becomes controlled, by way of a difference in voltages applied to the first control port and the second control port.

17. The sensor apparatus in accordance with claim 14, wherein at least one of (i) an output characteristic of the first voltage-controlled current source is linear and (ii) an output characteristic of the second voltage-controlled current source is non-linear.

18. The sensor apparatus in accordance with claim 14, wherein the first voltage-controlled current source is implemented by at least one of an operational amplifier and a transistor.

19. The sensor apparatus in accordance with claim 14, wherein at least one of (i) the second voltage-controlled current source is implemented as a differential amplifier and (ii) the second voltage-controlled current source is implemented by way of two transistors.

20. The sensor apparatus in accordance with claim 10, wherein at least one of a housing and an interface is provided, wherein at least one of the following is at least one of (i) arranged and (ii) formed at at least one of the housing and the interface:
the current source port;
the adder input port;
the adder output port;
a control port associated with a first voltage-controlled current source for controlling the first voltage-controlled current source;
a port for a resistor associated with a first voltage-controlled current source for controlling the first voltage-controlled current source;
at least one of a first control port and a second control port associated with a second voltage-controlled current source for controlling the second voltage-controlled current source;
a port for a resistor associated with a second voltage-controlled current source for controlling the second voltage-controlled current source;
at least one offset voltage port for at least one of (i) applying and (ii) incoupling the at least one offset voltage;
at least one of a first supply port and a second supply port, wherein an operating voltage is capable of being applied, or is applied, between the first supply port and the second supply port for supplying energy to at least one of the electronic module and the sensor apparatus.

21. A sensor apparatus, comprising
an electronic module, said electronic module comprising:
at least one voltage-controlled current source;
a current source port which is operatively and electrically connected to the at least one voltage-controlled current source for providing a voltage-controlled current by way of the at least one voltage-controlled current source;

an adder device;
an adder input port which is operatively and electrically connected to the adder device and is adapted to establish connections between the adder device and at least one first external device;
and an adder output port which is operatively and electrically connected to the adder device and is adapted to establish connections between the adder device and at least one second external device;
wherein the current source port is operatively and electrically connected, or operatively and electrically connectable, to at least one of an electrical resonant circuit and a coil element;
wherein the adder input port is operatively and electrically connectable, or is operatively and electrically connected, to the current source port or to at least one further coil element;
wherein by way of the adder device, at least one of an operation of addition and an operation of subtraction of a voltage applied to the adder input port and at least one offset voltage is performed; wherein an evaluation signal for evaluation by an evaluation device is providable, or is provided, at the adder output port; and
wherein a coil element is provided which is or becomes operatively and electrically connected to the current source port;
wherein the at least one first external device comprises the electrical resonant circuit and the coil element; and the at least one second external device comprises the evaluation device.

22. The sensor apparatus in accordance with claim 21, wherein the coil element is or becomes operatively and electrically connected to the adder input port.

23. The sensor apparatus in accordance with claim 21, wherein the current source port and the adder input port are or become operatively and electrically connected.

24. The sensor apparatus in accordance with claim 21, wherein at least one further coil element is provided which is or becomes operatively and electrically connected to the adder input port.

25. The sensor apparatus in accordance with claim 24, wherein two further coil elements are provided which are or become operatively and electrically connected to the adder input port.

26. The sensor apparatus in accordance with claim 21, wherein a first voltage-controlled current source is provided which is or becomes operatively and electrically connected to the current source port for providing the voltage-controlled current, wherein a control port is associated with the first voltage-controlled current source and wherein the first voltage-controlled current source is controllable, or becomes controlled, by way of a voltage applied to the control port.

27. The sensor apparatus in accordance with claim 26, wherein the first voltage-controlled current source is at least one of controllable and/or activatable or is at least one of controlled and activated by way of at least one of an evaluation device and a pulse signal source and a pulse signal.

28. The sensor apparatus in accordance with claim 21, wherein a second voltage-controlled current source is provided which is or becomes operatively and electrically connected to the current source port for providing the voltage-controlled current, wherein a first control port and a second control port are associated with the second voltage-controlled current source and wherein the second voltage-controlled current source is controllable, or becomes controlled, by a difference in voltages applied to the first control port and the second control port.

29. The sensor apparatus in accordance with claim 28, wherein at least one of (i) the second voltage-controlled current source is deactivated or becomes deactivated, and (ii) the first control port and the second control port are at equal electrical potentials or are caused to be at equal electrical potentials.

30. A set of sensor apparatuses, comprising at least two different sensor apparatuses selected from any of the following:
(i) a sensor apparatus, comprising:
an electronic module, comprising:
at least one voltage-controlled current source;
a current source port which is operatively and electrically connected to the at least one voltage-controlled current source for providing a voltage-controlled current by way of the at least one voltage-controlled current source;
an adder device;
an adder input port which is operatively and electrically connected to the adder device and is adapted to establish connections between the adder device and at least one first external device; and
an adder output port which is operatively and electrically connected to the adder device and is adapted to establish connections between the adder device and at least one second external device;
wherein the current source port is operatively and electrically connected, or operatively and electrically connectable, to at least one of an electrical resonant circuit and a coil element;
wherein the adder input port is operatively and electrically connectable, or is operatively and electrically connected, to the current source port or to at least one further coil element;
wherein by way of the adder device, at least one of an operation of addition and an operation of subtraction of a voltage applied to the adder input port and at least one offset voltage is performed;
wherein an evaluation signal for evaluation by an evaluation device is providable, or is provided, at the adder output port;
wherein an electrical resonant circuit is provided which is or becomes operatively and electrically connected to the current source port and the adder input port;
wherein the at least one first external device comprises the electrical resonant circuit and the coil element; and
the at least one second external device comprises the evaluation device; and
(ii) a sensor apparatus, comprising:
an electronic module, comprising:
at least one voltage-controlled current source;
a current source port which is operatively and electrically connected to the at least one voltage-controlled current source for providing a voltage-controlled current by way of the at least one voltage-controlled current source;
an adder device;
an adder input port which is operatively and electrically connected to the adder device and is adapted to establish connections between the adder device and at least one first external device; and
an adder output port which is operatively and electrically connected to the adder device and is adapted to establish connections between the adder device and at least one second external device;

wherein the current source port is operatively and electrically connected, or operatively and electrically connectable, to at least one of an electrical resonant circuit and a coil element;

wherein the adder input port is operatively and electrically connectable, or is operatively and electrically connected, to the current source port or to at least one further coil element;

wherein by way of the adder device, at least one of an operation of addition and an operation of subtraction of a voltage applied to the adder input port and at least one offset voltage is performed;

wherein an evaluation signal for evaluation by an evaluation device is providable, or is provided, at the adder output port;

wherein a coil element is provided which is or becomes operatively and electrically connected to the current source port;

wherein the at least one first external device comprises the electrical resonant circuit and the coil element; and the at least one second external device comprises the evaluation device.

* * * * *